(12) United States Patent
Tankasala et al.

(10) Patent No.: US 12,189,955 B2
(45) Date of Patent: Jan. 7, 2025

(54) SKIP PROGRAM VERIFY FOR DYNAMIC START VOLTAGE SAMPLING

(71) Applicant: Intel NDTM US LLC, Santa Clara, CA (US)

(72) Inventors: Archana Tankasala, Sunnyvale, CA (US); Sagar Upadhyay, Folsom, CA (US); Shantanu R. Rajwade, San Mateo, CA (US); Aliasgar S. Madraswala, Folsom, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 0 days.

(21) Appl. No.: 18/089,969

(22) Filed: Dec. 28, 2022

(65) Prior Publication Data
US 2023/0161478 A1    May 25, 2023

(51) Int. Cl.
*G06F 3/06* (2006.01)
(52) U.S. Cl.
CPC ............ *G06F 3/0611* (2013.01); *G06F 3/064* (2013.01); *G06F 3/0653* (2013.01); *G06F 3/0679* (2013.01)

(58) Field of Classification Search
CPC ...... G06F 3/0611; G06F 3/064; G06F 3/0653; G06F 3/0679
See application file for complete search history.

(56) References Cited

U.S. PATENT DOCUMENTS 10,224,107 B1    3/2019  Sule et al.
2021/0398604 A1*  12/2021  Li ...................... G06F 11/1068

* cited by examiner

*Primary Examiner* — Yong J Choe
(74) *Attorney, Agent, or Firm* — Compass IP Law PC

(57) ABSTRACT

Skip program verify for dynamic start voltage (DSV) sampling reduces latency of a program operation on multi-level cell (MLC) memory having at least two pages and programmable with multiple threshold voltage levels, such as a Triple Level Cell (TLC) NAND device. The NAND device skips program verifies corresponding to higher levels of voltage thresholds during DSV sampling. As a result, the NAND device can reduce a total program time (tPROG) to program the MLC memory, and determine the dynamic start program voltage more quickly. The NAND device can improve an effective TLC NAND tPROG by as much as 2% without impacting the placement of the first sub-block being programmed. The skipped program verifies corresponding to the higher levels of voltage thresholds are resumed as soon as DSV sampling is complete.

20 Claims, 6 Drawing Sheets

SKIP PROGRAM VERIFY FOR DYNAMIC START VOLTAGE SAMPLING

FIELD OF THE INVENTION

This disclosure relates to NAND memory and, more particularly, to program operations for multi-threshold level NAND memory.

BACKGROUND OF THE INVENTION

NAND memory is a type of non-volatile memory that may be included in a solid state drive (SSD) or other types of storage devices to store data. Some NAND memories such as Single Level Cell (SLC) NAND memories store one bit of data per cell. Other NAND memories such as Multi-Level Cell (MLC) NAND memories store multiple bits of data per cell (e.g., two bits, three bits, etc.). MLC NAND memories that store three and four bits of data per cell are referred to respectively as Triple Level Cell (TLC) and Quad Level Cell (QLC) memories. Newer generations of MLC memories can store even more bits per cell, such as Penta Level Cell (PLC) memories that store five bits per cell. As used herein, the term MLC memory collectively refers to NAND memory, including TLC, QLC and PLC memories. The term NAND memory includes three-dimensional (3D) NAND memory.

Although MLC NAND memories enable greater data densities (e.g., multiple bits of data per cell), they take longer to program (e.g., have slower write speeds or longer write times) to write the same data relative to SLC memories. For example, SLC memories can be written approximately seven to eight times faster than TLC memories because writing one bit per cell requires less programming pulses to change electrical characteristics of an SLC memory cell to represent one bit as compared to writing multiple bits per cell which requires more programming pulses. For this reason, while the higher densities of MLC NAND memory offer significant cost savings in terms of the amount of data that can be stored, the time required to program pages of higher density NAND increases significantly as compared to lower density NAND because of the increase in the density of data programmed per cell.

BRIEF DESCRIPTION OF THE DRAWINGS

The described embodiments are illustrated by way of example and not limitation in the figures of the accompanying drawings, in which like references indicate similar elements and in which.

Figure 1:
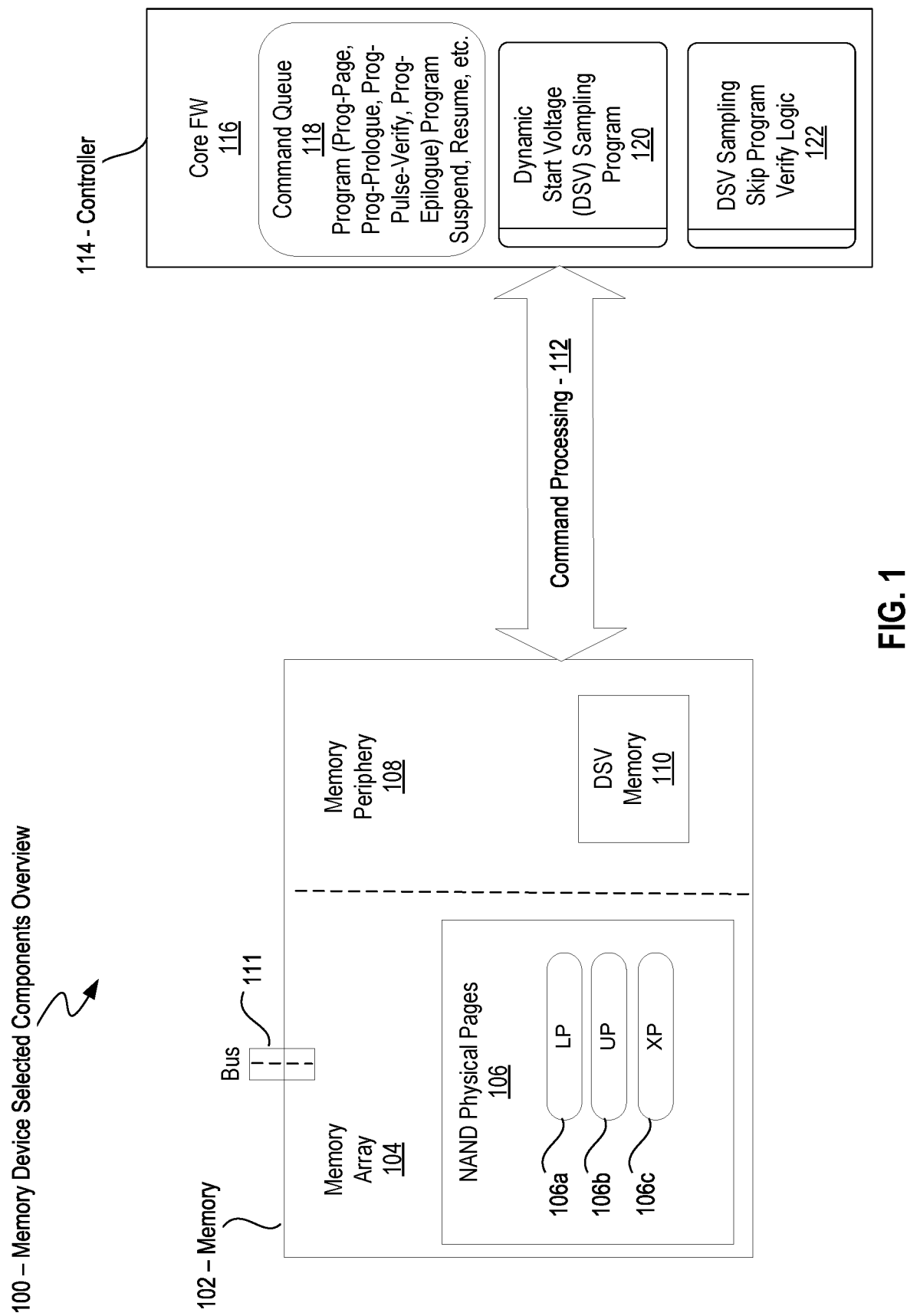
FIG. 1 is a block diagram of selected components of a memory device in which skip program verify for dynamic start voltage (DSV) sampling reduces program latency for NAND memory in accordance with various examples described herein.

Other features of the described embodiments will be apparent from the accompanying drawings and from the detailed description that follows.

DETAILED DESCRIPTION

Non-volatile memory refers to memory whose state is determinate even if power is interrupted to the device. Storage devices that include non-volatile memory include a secure digital card, a multimedia card, a flash drive (for example, a Universal Serial Bus (USB) flash drive also known as a "USB thumb drive" or "USB memory stick" that includes non-volatile memory with an integrated USB interface), and a solid-state drive (SSD).

In a NAND flash memory, variously referred to as a NAND device, NAND media, NAND memory or NAND, the memory cells can be arranged in rows and columns to form a non-volatile memory array referred to as a NAND array. In a 3D NAND device the memory cells are stacked in multiple layers. Data is read and written (programmed) page by page and erased block by block. A TLC NAND flash memory includes three pages (XP-extra, UP-upper, LP-lower) per wordline and a QLC NAND flash memory includes four pages (TP-top, XP, UP, LP) per wordline. A PLC NAND flash memory includes five pages.

In a TLC memory cell, eight different threshold voltage levels (Vt) may be used to represent three bits of data. The first bit is LP data, the second bit is UP data, and third bit of data is XP data. The eight different threshold voltage levels (Vt) are referred to as Level 0 (L0), Level 1 (L1), Level 2 (L2) and so forth up to Level 7 (L7). In a QLC memory cell, sixteen different threshold voltage levels (Vt), e.g., Level 0 (L0), Level 1 (L1), Level 2 (L2) and so forth up to Level 15 (L15), may be used to represent four bits of data in four pages of data, in TP, XP, UP and LP pages. In a PLC memory cell, thirty-two different threshold voltage levels (Vt) may be used to represent five bits of data in five pages of data.

Programming is achieved by applying a series of program pulses with increasing magnitude to the control gate of the NAND cells in the NAND array. Each program pulse is followed by a series of program verifies to compare the voltage level of the NAND cells against the program verify threshold voltage level. The series of program verifies correspond to the different threshold voltage levels being programmed. For example, in a TLC NAND media device, each cell is programmed to one of the eight different threshold voltage levels (e.g., Vt=L0, L1, L2, . . . , L7) based on the 3-bit data that is written into that cell. In a one-pass programming algorithm, the voltages for all of the levels are programmed in the memory cell using a series of pulses until the desired voltage levels are reached.

Among other arrangements, memory cells of the NAND array can be arranged into sub-blocks and blocks of sub-blocks. A wordline in a sub-block of a block-addressable NAND device can be used to program multiple pages worth of data. For example, a wordline in a sub-block of a block-addressable QLC NAND device can be used to program four pages worth of data as compared to a TLC NAND media device, in which the wordline can be used to program only three pages worth of data.

The number of program pulses applied to a sub-block prior to starting the first threshold voltage level of programming, L1, can vary based on the position of the sub-block relative to other sub-blocks. For example, the number of program pulses that are applied to the first sub-block of an arrangement of sub-blocks, referred to herein as sub-block0, is typically greater than the number of program pulses that are applied to the next sub-blocks in the arrangement of sub-blocks, e.g., to sub-block1, to sub-block2, . . . or to sub-blockN, prior to starting programming L1.

Because program pulses with lower magnitude are not expected to place the cells targeted by the program pulses to higher voltage threshold levels, there is no need to verify all eight different threshold voltage levels after each program pulse. For this reason, to minimize the NAND program time, i.e., time needed to program a NAND array with data, current program algorithms in NAND devices generally kick in the lower-level program verifies for lower magnitude program pulses earlier while higher-level program verifies are skipped. The NAND kicks in the higher-level program-verifies later with respect to a program pulse count (after a certain number of program pulses have been counted).

Because skipping certain program verifies for certain program pulses is currently defined and optimized based on the non-sub-block0 program pulse count, and the sub-block0 program takes many more pulses than non-sub-block0 program prior to the start of programming the L1 threshold voltage level, higher-level program verifies kick in much earlier in the sub-block0 program than in non-sub-block0 programs with respect to the program pulse magnitude. In other words, because the sub-block0 program takes many more pulses than the non-sub-block0 program, the series of pulses applied to sub-block0 increases in magnitude more quickly than in the non-sub-block0 program, resulting in the higher-level program verifies kicking in much earlier as well. For this reason, the sub-block0 program takes a longer time to complete than the non-sub-block0 programs.

To overcome this performance challenge, and minimize the longer time to completion for the sub-block0 program, embodiments of a skip program verify for DSV sampling reduce the amount of time to reach the minimum program pulse voltage during DSV sampling.

Because DSV sampling sub-blocks are the first sub-block in the group of sub-blocks targeted by the program pulses, e.g., sub-block0, DSV sampling sub-blocks take a longer time to complete for the same reason that the sub-block0 program takes a longer time to complete as noted above. For example, the number of program pulses applied to DSV sampling sub-blocks are different than the number of program pulses applied to non-sampling sub-blocks. During DSV sampling, the NAND device samples the minimum program pulse voltage required to move a certain number of cells above L1 threshold voltage during the sub-block0 program (i.e., the first sub-block of the sub-blocks being targeted) and applies that minimum program pulse voltage as the starting voltage for subsequent non-sampling sub-block programs for faster execution.

Because DSV sampling is typically performed on the first sub-block of a targeted set of sub-blocks, embodiments of the skip program verify logic can reduce the time to completion of the sub-block0 program during DSV sampling. For example, in one embodiment, a skip program verify logic verifies only the L1 threshold voltage level and skips the higher threshold voltage levels (e.g., L2-L7) until DSV sampling is complete. Verifying the remaining higher threshold voltage levels (e.g., L2-L7) only resumes with respect to the program pulse count after the DSV sampling is complete. In other embodiments, a skip program verify logic might verify only one or more of the lower threshold voltage levels, e.g., L1 and L2 threshold voltage levels, and skip the remaining higher threshold voltage levels (e.g., L3-L7, or L3-L15) until DSV sampling is complete.

In one embodiment, DSV sampling sub-blocks are any sub-blocks that are sampled to dynamically determine a start voltage, whereas sub-blocks that are targeted to program data are referred to herein as non-sampling sub-blocks. As noted earlier, DSV sampling sub-blocks are typically the first sub-block in an arrangement of sub-blocks, i.e., sub-block0, located at the beginning of a wordline, whereas non-sampling sub-blocks are those that occur after sub-block0, e.g., sub-block1, sub-block2, . . . , sub-blockN. However, a power-interruption and program-continuation user can actually start programming a sub-block located at an intermediate location of the wordline. In that case, a DSV sampling sub-block can occur in the middle of the arrangement of sub-blocks. For example, sub-block5 can be sampled as a DSV sampling sub-block, and sub-block6, sub-block7, . . . , sub-blockN are programmed as non-sampling sub-blocks. For ease of illustration in the description that follows, a DSV sampling sub-block is generally referred to as sub-block0.

The NAND total program time, referred to herein as tPROG, consists of input/output (I/O) latency (data input) plus the time needed to program the NAND array with data. With a one-pass programming algorithm in a TLC, total I/O latency is equal to the I/O latency per plane times the number of planes times the number of pages. As an example, I/O latency expressed in microseconds (μs) in a memory module with a per plane I/O latency of 15 μs and 1800 mega transfers per second (MT/s) is:

$$15 \text{ μs} * 4 * 3 = \sim 180 \text{ μs total I/O latency}$$

Embodiments of skip program verify for DSV sampling can reduce the amount of time to reach the minimum program pulse voltage and, in turn, reduce I/O latency, thereby improving the effective TLC tPROG by as much as 2%, resulting in a significant performance improvement. Moreover, because embodiments of skip program verify for DSV sampling are applied only to DSV sampling sub-blocks, the performance improvement can be achieved without impacting the placement of the first sub-block being programmed.

The following detailed description of the drawings that follow includes non-limiting examples of embodiments of skip program verify for DSV sampling.

With reference to FIG. 1, selected components of a memory device 100, such as a NAND device, in which skip program verify for DSV sampling can be implemented includes a memory 102 having a memory array 104 and a memory periphery 108 in communication with a bus 111 to a host interface (not shown). The memory array 104 comprises the physical NAND pages 106 of non-volatile memory, such as the LP 106a, UP 106b and XP 106c physical pages. The memory device 100 can include a DSV memory 110 to store DSV information associated with a physical page 106 of memory or any suitable portion of the memory array 104. The DSV information is typically obtained during DSV sampling and is used to aid in determination of a start program voltage.

In one embodiment, the selected components of the memory device 100 further include a controller 114. Among other components, the controller 114 can include core firmware 116 and a command queue 118. The command queue 118 is used to queue commands to issue to the memory array 104, such as commands to write, read, program, program-page, program-prologue, program pulse-verify, program-epilogue, program suspend, program resume, etc. During operation, the controller 114 can initiate command processing 112 in accordance with a command logic, such as command logic embodied in the core firmware 116.

In one embodiment, the command logic includes a DSV sampling program 120 that is typically applied to a first sub-block of a targeted set of sub-blocks to obtain DSV sampling information to store in DSV memory 110. Embodiments of skip program verify for DSV sampling includes a DSV sampling skip program verify logic 122. In one embodiment, the DSV sampling skip program verify logic 122 is performed in conjunction with the DSV sampling program 120 to reduce the amount of time required to reach the minimum program pulse voltage during DSV sampling. In one embodiment, the DSV sampling skip program verify logic 122 is only performed when active based on a mode register setting that indicates whether the logic is active or inactive. In one embodiment the performance of the DSV sampling skip program verify logic 122 can default to an active mode of operation in the absence of a mode register setting.

In a conventional programming flow, a DSV sampling operation in a one-pass programming algorithm for a TLC NAND employs the same sequence of program pulses followed by program verifies as employed in the program operation to program the physical pages 106 of the memory array 104. Embodiments of skip program verify logic for DSV sampling alters that sequence to reduce the amount of time required to reach the minimum program pulse voltage during DSV sampling.

Figure 2:
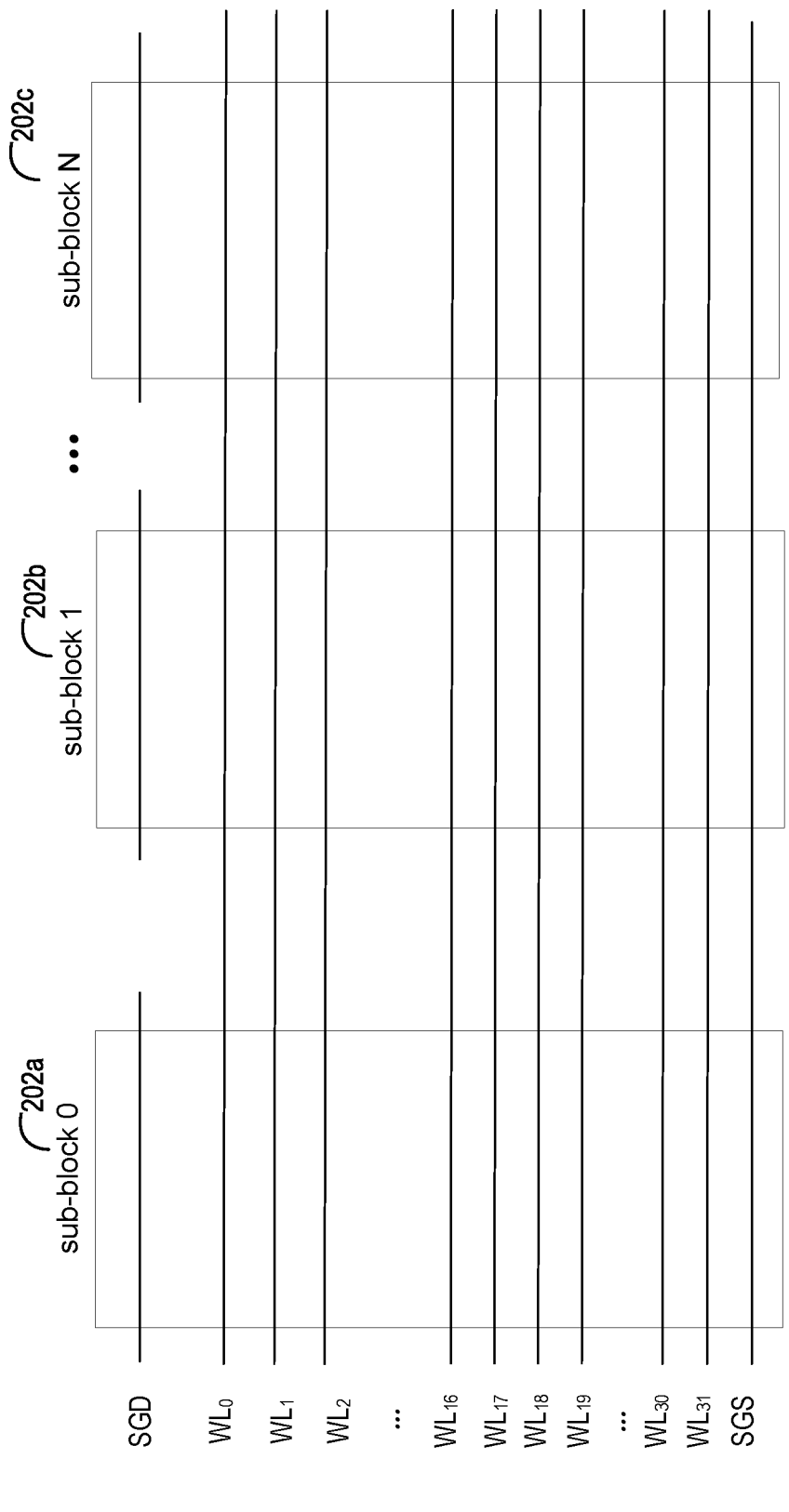
FIG. 2 illustrates example sub-blocks of a block of a memory device in accordance with various examples described herein.

FIG. 2 is a block diagram illustration of a memory array 104 arranged into a block 200 comprising a plurality of sub-blocks (sub-blocks 0-N) 202a, 202b, 202c in accordance with certain embodiments. Each sub-block (sub-blocks 0-N) 202a, 202b, 202c can comprise strings of series-connected memory cells. In one embodiment, a source select line controlled by source gate select signal SGS is shared by each series string of a block and each series string of a particular sub-block shares a drain select line (controlled by drain gate select signal SGD) with each sub-block having its own drain select line.

In one embodiment, each sub-block 202a, 202b, 202c (sub-blocks 0-N) may contain a single physical page 106a, 106b, 106c of memory for each wordline (WL$_0$ WL$_1$ . . . WL$_{31}$) of the subblock (in other embodiments, a subblock may contain multiple physical pages 106 of memory for each wordline). Thus, a block of memory may be divided into a large number of physical pages 106.

In one embodiment, a sub-block may also include memory cells for storing metadata associated with one or more physical pages 106. For example, a set of DSV memory cells 110 (FIG. 1) may be coupled to a corresponding wordline and may include DSV information (i.e., information indicative of an optimal start program voltage for a physical page of that wordline). In various embodiments, the DSV memory cells 110 associated with a physical page 106a, 106b, 106c may be programmed along with (e.g., during the same programming pass as) the physical page. Thus, the set of DSV memory cells 110 that are coupled to WL$_0$ may be programmed along with the other memory cells of sub-block0 that are coupled to WL$_0$, and the set of DSV memory cells 110 that are coupled to WL$_1$ may be programmed along with the other memory cells of sub-block0 that are coupled to WL$_1$, and so forth.

Figure 3:
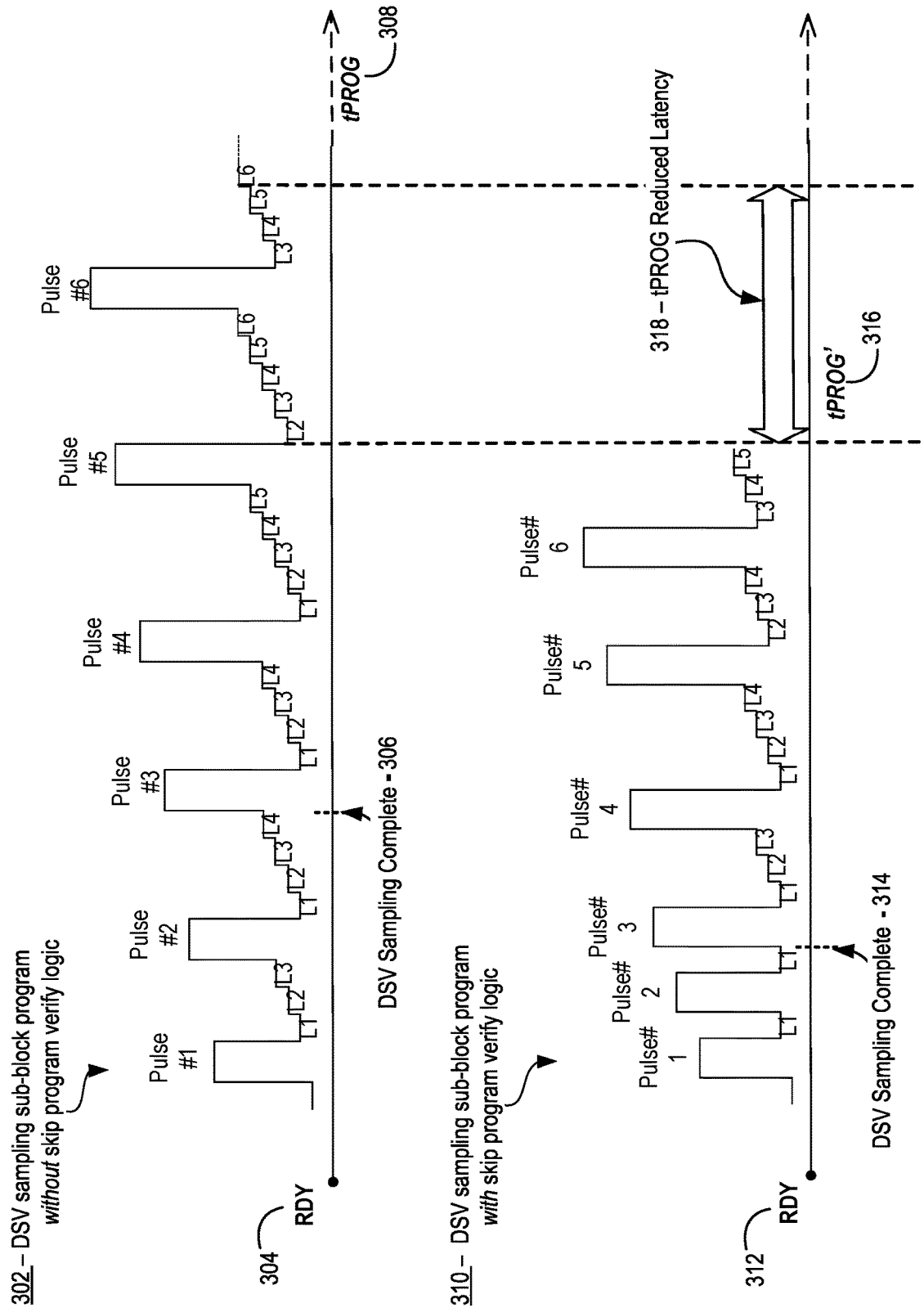
FIG. 3 illustrates example waveforms comparing an example DSV sampling operations with and without skip program verify logic in accordance with various examples described herein.

By way of example only, and not limitation, FIG. 3 is a timeline diagram of a TLC one-pass program operation comparing the DSV sampling program 120 (FIG. 1) performed in two examples, one example with 310 the benefit of the skip program verify logic 122 (FIG. 1) as in the described embodiments of skip program verify for DSV sampling, and one example without 302 the benefit of the skip program verify logic 122 (FIG. 1).

It should be noted that the timelines (RDY) 304/312 depicted in the timeline diagram of FIG. 3 is representational only for the purpose of relative comparison, and that exact completion times are not shown, nor are the timelines (RDY) 304/312 and the sequence of operations drawn to any exact scale. In addition, although the example 310 described in FIG. 3 and examples described elsewhere refer to embodiments of skip program verify for DSV sampling for a TLC memory, other types of MLC memory can benefit from the embodiments of skip program verify for DSV sampling, including QLC and PLC memories with greater density and more voltage levels than TLC memory.

With reference to the example without 302 the benefit of the skip program verify logic 122, a series of program pulses, Pulse #1, Pulse #2, Pulse #3, Pulse #4, Pulse #5 and Pulse #6, of increasing magnitude are applied to a first sub-block of multiple sub-blocks, the first sub-block functioning as a sampling sub-block. The pulses of increasing magnitude can be applied to a DSV sampling sub-block, for example, until a minimum program pulse voltage to start programming the multiple sub-blocks has been reached. In the illustrated example, the DSV sampling is complete at time marker 306, after the completion of the program pulse and program verify loops for Pulse #1/L1, L2, L3, and for Pulse #2/L1, L2, L3, and L4. The determined minimum program pulse voltage is then used start programming the multiple sub-blocks, beginning with Pulse #3 and continuing with Pulse #4, Pulse #5 and Pulse #6 and so forth, followed by the program verifies corresponding to multiple threshold voltage levels L1-L7, until the programming of the multiple sub-blocks is complete. The total program time, tPROG, is indicated at time marker 308.

With reference to the example with 310 the benefit of the skip program verify logic 122, the same series of program pulses, Pulse #1, Pulse #2, Pulse #3, Pulse #4, Pulse #5 and Pulse #6, of increasing magnitude are applied to the first sub-block of multiple sub-blocks as in example 302 until a minimum program pulse voltage to start programming the multiple sub-blocks has been reached. This time, the skip program verify logic 122 is employed, and the DSV sampling is complete at time marker 314, much earlier than before, at time marker 306. As illustrated, the higher level program verifies L2/L3 for program Pulse #1, and higher level program verifies L2/L3/L4 for program Pulse #2, have been skipped, allowing DSV sampling to reach completion earlier than before. The earlier-determined minimum program pulse voltage is then used to start programming the multiple sub-blocks, beginning with Pulse #3 and continuing with Pulse #4, Pulse #5 and Pulse #6 and so forth, followed by the program verifies corresponding to multiple threshold voltage levels L1-L7, as needed, until the programming of the multiple sub-blocks is complete.

As illustrated, skipping program verifies of higher threshold voltages until after DSV sampling is complete reduces the programming time. For example, after employing the skip program verify logic 122, the number of program verifies following Pulse #3, L1/L2/L3, is fewer than the number of program verifies following Pulse #3, L1/L2/L3/L4 in the example without 302 the skip program verify logic 122. Similar reductions in higher level program verifies is seen following Pulse #4, Pulse #5 and Pulse #6. The resulting tPROG reduced latency, 318, yields a significantly reduced total program time, tPROG', as indicated at time marker 316.

Figure 4:
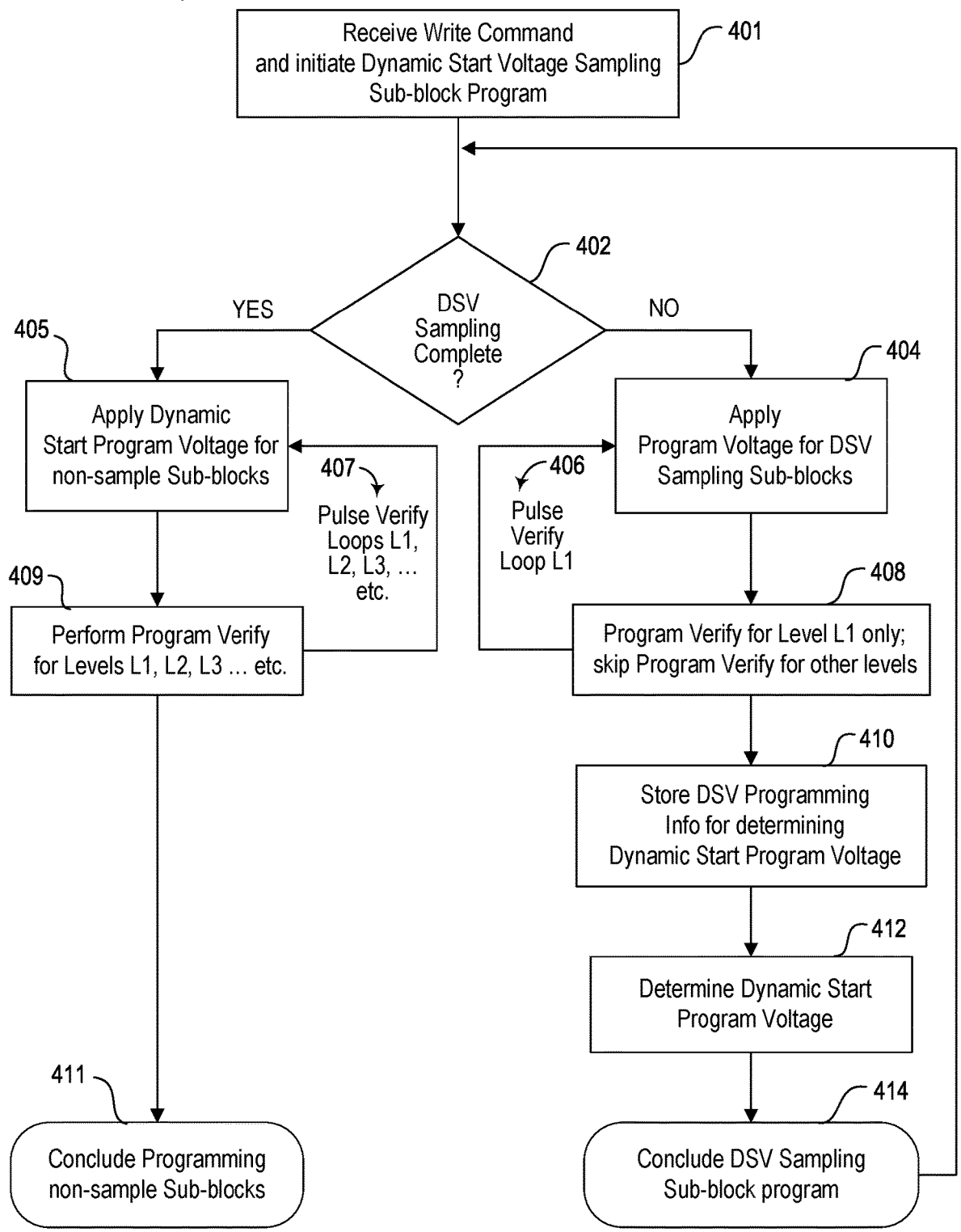
FIG. 4 is a process diagram illustrating a process flow for skip program verify logic for a DSV sampling in accordance with various examples described herein.

FIG. 4 is a process diagram illustrating process flows for performing a skip program verify logic for DSV sampling of a TLC NAND device in accordance with various examples described herein. Similar process flows can be used for embodiments of a skip program verify for DSV sampling of higher density NAND devices, such as QLC and PLC NAND.

In one embodiment, process 400 begins at process block 401 in which the controller receives a write command and initiates a DSV sampling sub-block program for targeted sub-blocks of a memory array in a memory device. At decision block 402 the controller determines whether DSV sampling is complete. If not, the process 400 commences performing a DSV sampling program at 404 by applying a series of program pulses of increasing magnitude to a DSV sampling sub-block, starting with a default program pulse voltage, where the DSV sampling sub-block is the first sub-block of the targeted sub-blocks.

At 408, and by way of example only, the process 400 repeats, performing a program pulse/program verify loop 406 for only the L1 voltage threshold level until reaching the minimum program pulse voltage, and skipping program verifies for all other levels, L2-L7. In one embodiment, for example, for performing a skip program verify logic for DSV sampling of a QLC NAND device the program pulse/program verify loop 406 could be performed for one or more of the lower threshold voltage levels, e.g., L1 and L2, until reaching the minimum program pulse voltage, while skipping program verifies for all other levels, L3-L15.

In one embodiment, upon reaching the minimum program pulse voltage to start to program the targeted sub-blocks, the process 400 continues at 410 to store the DSV programming information obtained for the minimum program pulse voltage. The process 400 continues at 412 to determine a dynamic start program voltage based on the DSV programming information for the minimum program pulse voltage. The process 400 concludes the DSV sampling sub-block program at 414.

In one embodiment, process 400 branches to 405 upon determining that the DSV sampling is complete, and commences applying a series of program pulses of increasing magnitude to the targeted sub-blocks of the memory array, i.e., the non-sample sub-blocks, using the determined dynamic start program voltage (from block 412). At 409, the process 400 continues, and resumes performing pulse verify loops 407 for all of the levels of voltage threshold levels, as needed, rather than skipping them, until at 411 the program operations for the non-sample sub-blocks are completed.

Figure 5:
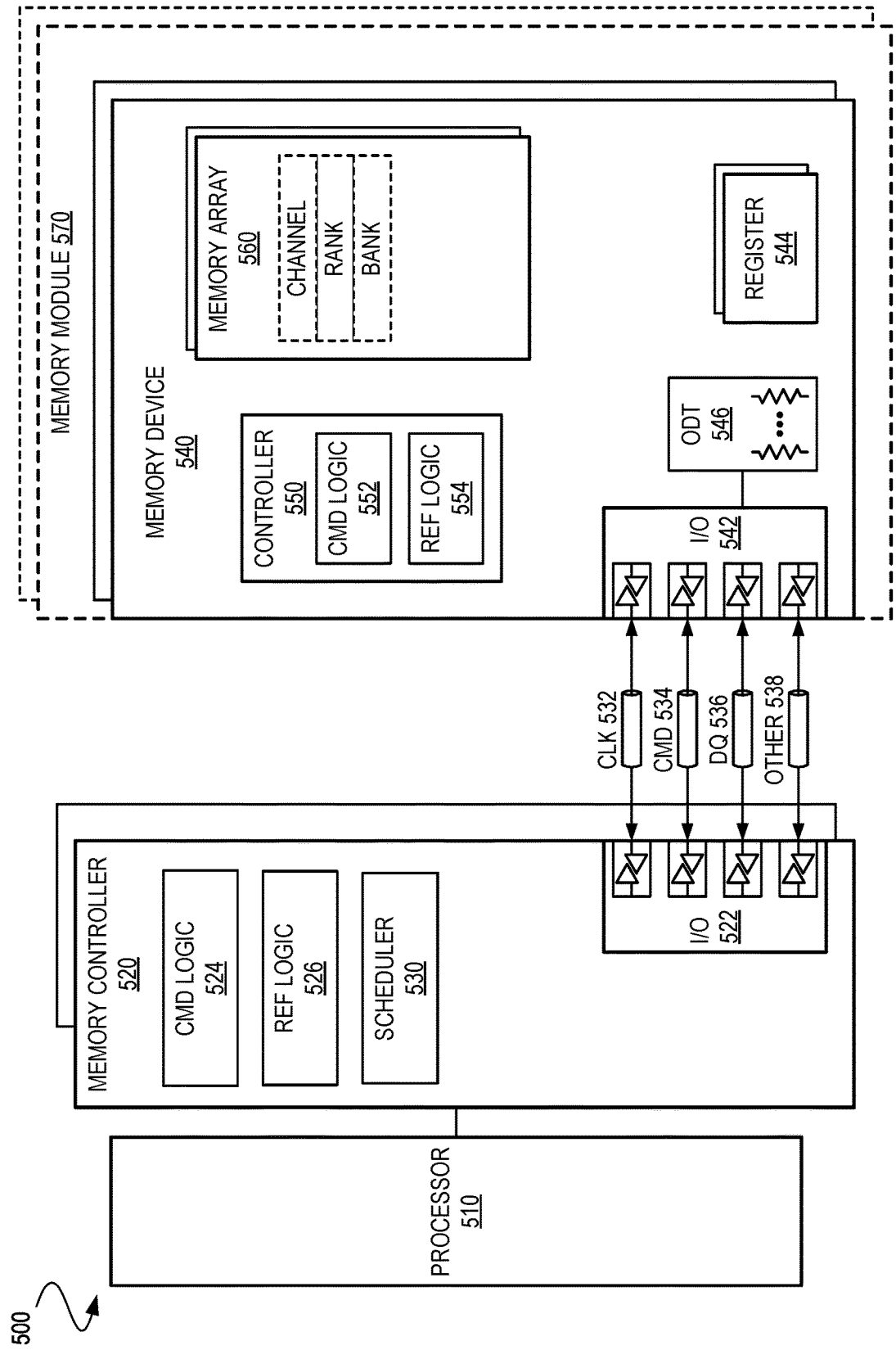
FIG. 5 is a block diagram of an embodiment of a memory subsystem in which skip program verify for DSV sampling can be implemented in accordance with various examples described herein.

FIG. 5 is a block diagram of an example of a system 500 in which skip program verify for DSV sampling can be implemented. System 500 includes a processor 510 and elements of a memory subsystem in a computing device, including one or more memory controller(s) 520 and memory device(s) 540 contained in memory modules 570. The computing device can include, but is not limited to, a server, a workstation computer, a desktop computer, a laptop computer, a tablet computer and/or a mobile device.

Processor 510 represents a processing unit of a computing platform that may execute an operating system (OS) and applications, which can collectively be referred to as the host or the user of the memory. An OS can be implemented in software that manages computer hardware and other software including memory allocation and access to I/O devices. Examples of operating systems include Microsoft® Windows®, Linux®, iOS® and Android®.

The OS and applications execute operations that result in memory accesses. Processor 510 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. A GPU can include one or more GPU cores and a GPU cache which can store graphics related data for the GPU core. The GPU core can internally include one or more execution units and one or more instruction and data caches. Additionally, the GPU can contain other graphics logic units such as one or more vertex processing units, rasterization units, media processing units, and codecs.

Memory accesses may also be initiated by devices such as a network controller or hard disk controller. Such devices can be integrated with the processor in some systems or attached to the processer via a bus (e.g., PCIe), or a combination. System 500 can be implemented as a System-on-a-Chip ("SoC") or be implemented with standalone components. which combines processor, graphics, memory, and Input/Output (I/O) control logic into one SoC package, also referred to as System-on-Package ("SoP").

Reference to memory device(s) 540 can apply to different memory types. For example, memory device(s) 540 can include volatile memory and nonvolatile memory. Volatile memory is memory whose state (and therefore the data stored on it) is indeterminate if power is interrupted to the memory device. Dynamic volatile memory requires refreshing the data stored in the memory device to maintain state. One example of dynamic volatile memory includes DRAM (dynamic random access memory), or some variant such as synchronous DRAM (SDRAM).

In contrast to volatile memory, nonvolatile memory is memory whose state is determinate even if power is interrupted to the memory device. In one example, the nonvolatile memory device is a block addressable memory device, such as a device that can use NAND (not AND) or NOR (not OR) technologies, multi-threshold level NAND flash memory, including single or multi-level Phase Change Memory (PCM), (for example, Single-Level Cell ("SLC"), Multi-Level Cell ("MLC"), Quad-Level Cell ("QLC"), Tri-Level Cell ("TLC"), and Penta-Level Cell ("PLC") or some other NAND).

In one embodiment, the memory device 540 may be or may include memory devices that use chalcogenide glass, a resistive memory, nanowire memory, ferroelectric random-access memory (FeRAM), ferroelectric transistor random access memory (FeTRAM), anti-ferroelectric memory, nanowire-based non-volatile memory, memory that incorporates memristor technology, magnetoresistive random access memory (MRAM) memory that incorporates memristor technology, resistive memory including the metal oxide base, the oxygen vacancy base and the conductive bridge Random Access Memory (CB-RAM), spin-transfer torque memory (STT-RAM) or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product.

A memory subsystem as described herein may be compatible with a number of memory technologies, such as DDR4 (double data rate (DDR) version 4, JESD79-4, originally published in September 2012 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (LPDDR version 5, JESD209-5, originally published by JEDEC in February 2019), HBM2 ((HBM version 2), currently in discussion by JEDEC), or others, or combinations of memory technologies and technologies based on derivatives or extensions of such specifications.

Memory controller 520 represents one or more memory controller circuits or devices for system 500. Memory controller 520 represents control logic that generates memory access commands in response to the execution of operations by processor 510. Memory controller 520 accesses one or more memory devices 540. Memory devices 540 can be DRAM devices in accordance with any referred to above. In one example, memory devices 540 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 520 manages a separate memory channel, although system 500 can be configured to have multiple channels managed by a single controller, or to have multiple controllers on a single channel. In one example, memory controller 520 is part of host processor 510, such as logic implemented on the same die or implemented in the same package space as the processor.

Memory controller 520 includes I/O interface logic 522 to couple to a memory bus, such as a memory channel as referred to above. I/O interface logic 522 (as well as I/O interface logic 542 of memory device 540) can include pins, pads, connectors, signal lines, traces, or wires, or other hardware to connect the devices, or a combination of these. I/O interface logic 522 can include a hardware interface. As illustrated, I/O interface logic 522 includes at least drivers/transceivers for signal lines. Commonly, wires within an integrated circuit interface couple with a pad, pin, or connector to interface signal lines or traces or other wires between devices. I/O interface logic 522 can include drivers, receivers, transceivers, or termination, or other circuitry or combinations of circuitry to exchange signals on the signal lines between the devices. The exchange of signals includes at least one of transmit or receive. While shown as coupling I/O 522 from memory controller 520 to I/O 542 of memory device 540, it will be understood that in an implementation of system 500 where groups of memory devices 540 are accessed in parallel, multiple memory devices can include I/O interfaces to the same interface of memory controller 520. In an implementation of system 500 including one or more memory modules 570, I/O 542 can include interface hardware of the memory module in addition to interface hardware on the memory device itself. Other memory controllers 520 will include separate interfaces to other memory devices 540. For example, I/O 542 can also communicate with a solid-state drive ("SSD") which includes an SSD controller, a host interface, a volatile memory and a non-volatile memory device that includes one or more non-volatile memory arrays and controllers.

The bus between memory controller 520 and memory devices 540 can be implemented as multiple signal lines coupling memory controller 520 to memory devices 540. The bus may typically include at least clock (CLK) 532, command/address (CMD) 534, and write data (DQ) and read data (DQ) 536, and zero or more other signal lines 538. In one example, a bus or connection between memory controller 520 and memory can be referred to as a memory bus. In one example, the memory bus is a multi-drop bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 500 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 520 and memory devices 540. An example of a serial bus technology is 8B10B encoding and transmission of high-speed data with embedded clock over a single differential pair of signals in each direction. In one example, CMD 534 represents signal lines shared in parallel with multiple memory devices. In one example, multiple memory devices share encoding command signal lines of CMD 534, and each has a separate chip select (CS_n) signal line to select individual memory devices.

It will be understood that in the example of system 500, the bus between memory controller 520 and memory devices 540 includes a subsidiary command bus CMD 534 and a subsidiary bus to carry the write and read data, DQ 536. In one example, the data bus can include bidirectional lines for read data and for write/command data. In another example, the subsidiary bus DQ 536 can include unidirectional write signal lines for write and data from the host to memory, and can include unidirectional lines for read data from the memory to the host. In accordance with the chosen memory technology and system design, other signals 538 may accompany a bus or sub bus, such as strobe lines DQS. Based on design of system 500, or implementation if a design supports multiple implementations, the data bus can have more or less bandwidth per memory device 540. For example, the data bus can support memory devices that have either a x4 interface, a x8 interface, a x16 interface, or other interface. The convention "xW," where W is an integer that refers to an interface size or width of the interface of memory device 540, which represents a number of signal lines to exchange data with memory controller 520. The interface size of the memory devices is a controlling factor on how many memory devices can be used concurrently per channel in system 500 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 540 and memory controller 520 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length eight (BL8), and each memory device 540 can transfer data on each UI. Thus, a x8 memory device operating on BL8 can transfer 84 bits of data (8 data signal lines times 8 data bits transferred per line over the burst). It will be understood that this simple example is merely an illustration and is not limiting.

Memory devices 540 represent memory resources for system 500. In one example, each memory device 540 is a separate memory die. In one example, each memory device 540 can interface with multiple (e.g., 2) channels per device or die. Each memory device 540 includes I/O interface logic 542, which has a bandwidth determined by the implementation of the device (e.g., x16 or x8 or some other interface bandwidth). I/O interface logic 542 enables the memory devices to interface with memory controller 520. I/O interface logic 542 can include a hardware interface, and can be in accordance with I/O 522 of memory controller, but at the memory device end. In one example, multiple memory devices 540 are connected in parallel to the same command and data buses. In another example, multiple memory devices 540 are connected in parallel to the same command bus, and are connected to different data buses. For example, system 500 can be configured with multiple memory devices 540 coupled in parallel, with each memory device responding to a command, and accessing memory resources such as one or more memory arrays 560 internal to each. For a Write operation, an individual memory device 540 can write a portion of the overall data word, and for a Read operation, an individual memory device 540 can fetch a portion of the overall data word. The remaining bits of the word will be provided or received by other memory devices in parallel.

In one example, memory devices 540 are disposed directly on a motherboard or host system platform (e.g., a PCB (printed circuit board) on which processor 510 is disposed) of a computing device. In one example, memory devices 540 can be organized into memory modules 570. In one example, memory modules 570 represent dual inline memory modules (DIMMs). In one example, memory modules 570 represent other organization of multiple memory devices to share at least a portion of access or control circuitry, which can be a separate circuit, a separate device, or a separate board from the host system platform. Memory modules 570 can include multiple memory devices 540, and the memory modules can include support for multiple separate channels to the included memory devices disposed on them. In another example, memory devices 540 may be incorporated into the same package as memory controller 520, such as by techniques such as multi-chip-module (MCM), package-on-package, through-silicon via (TSV), or other techniques or combinations. Similarly, in one example, multiple memory devices 540 may be incorporated into memory modules 570, which themselves may be incorporated into the same package as memory controller 520. It will be appreciated that for these and other implementations, memory controller 520 may be part of host processor 510.

Memory devices 540 each include one or more memory arrays 560 collectively referred to as memory resources. Memory array 560 represents addressable memory locations or storage locations for data. Typically, memory array 560 is managed as rows of data, accessed via wordline (rows) and bitline (individual bits within a row) control. Memory array 560 can be organized as separate channels, ranks, and banks of memory. Channels may refer to independent control paths to storage locations within memory devices 540. Ranks may refer to common locations across multiple memory devices (e.g., same row addresses within different devices) in parallel. Banks may refer to sub-arrays of memory locations within a memory device 540. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 540 include one or more registers 544. Register 544 represents one or more storage devices or storage locations that provide configuration or settings for the operation of the memory device. In one example, register 544 can provide a storage location for memory device 540 to store data for access by memory controller 520 as part of a control or management operation. In one example, register 544 includes one or more mode registers. In one example, register 544 includes one or more multipurpose registers. The configuration of locations within register 544 can configure memory device 540 to operate in different "modes," where command information can trigger different operations within memory device 540 based on the mode. Additionally or in the alternative, different modes can also trigger different operation from address information or other signal lines depending on the mode. Settings of register 544 can indicate configuration for I/O settings (e.g., timing, termination or ODT (on-die termination) 546, driver configuration, or other I/O settings). In one embodiment, a setting of register 544 can indicate whether the memory includes configurable ECC memory that can be configured using a translation cache in accordance with the described embodiments.

In one example, memory device 540 includes ODT 546 as part of the interface hardware associated with I/O 542. ODT 546 can be configured as mentioned above, and provide settings for impedance to be applied to the interface to specified signal lines. In one example, ODT 546 is applied to DQ signal lines. In one example, ODT 546 is applied to command signal lines. In one example, ODT 546 is applied to address signal lines. In one example, ODT 546 can be applied to any combination of the preceding. The ODT settings can be changed based on whether a memory device is a selected target of an access operation or a non-target device. ODT 546 settings can affect the timing and reflections of signaling on the terminated lines. Careful control over ODT 546 can enable higher-speed operation with improved matching of applied impedance and loading. ODT 546 can be applied to specific signal lines of I/O interface 542, 522 (for example, ODT for DQ lines or ODT for CA lines), and is not necessarily applied to all signal lines.

Memory device 540 includes controller 550, which represents control logic within the memory device to control internal operations within the memory device. For example, controller 550 decodes commands sent by memory controller 520 and generates internal operations to execute or satisfy the commands. Controller 550 can be referred to as an internal controller, and is separate from memory controller 520 of the host. Controller 550 can determine what mode is selected based on register 544, and configure the internal execution of operations for access to memory resources 560 or other operations based on the selected mode. Controller 550 generates control signals to control the routing of bits within memory device 540 to provide a proper interface for the selected mode and direct a command to the proper memory locations or addresses. Controller 550 includes command logic 552, which can decode command encoding received on command and address signal lines. Thus, command logic 552 can be or include a command decoder. With command logic 552, memory device can identify commands and generate internal operations to execute requested commands.

Referring again to memory controller 520, memory controller 520 includes command (CMD) logic 524, which represents logic or circuitry to generate commands to send to memory devices 540. The generation of the commands can refer to the command prior to scheduling, or the preparation of queued commands ready to be sent. The signaling in memory subsystems generally includes address information within or accompanying the command to indicate or select one or more memory locations where the memory devices should execute the command. In response to scheduling of transactions for memory device 540, memory controller 520 can issue commands via I/O 522 to cause memory device 540 to execute the commands. In one example, controller 550 of memory device 540 receives and decodes command and address information received via I/O 542 from memory controller 520. Based on the received command and address information, controller 550 can control the timing of operations of the logic and circuitry within memory device 540 to execute the commands. Controller 550 is responsible for compliance with standards or specifications within memory device 540, such as timing and signaling requirements. Memory controller 520 can implement compliance with standards or specifications by access scheduling and control.

Memory controller 520 includes scheduler 530, which represents logic or circuitry to generate and order transactions to send to memory device 540. From one perspective, the primary function of memory controller 520 could be said to schedule memory access and other transactions to memory device 540. Such scheduling can include generating the transactions themselves to implement the requests for data by processor 510 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 520 typically includes logic such as scheduler 530 to allow selection and ordering of transactions to improve performance of system 500. Thus, memory controller 520 can select which of the outstanding transactions should be sent to memory device 540 in which order, which is typically achieved with logic much more complex that a simple first-in first-out algorithm. Memory controller 520 manages the transmission of the transactions to memory device 540, and manages the timing associated with the transaction. In one example, transactions have deterministic timing, which can be managed by memory controller 520 and used in determining how to schedule the transactions with scheduler 530.

In one example, memory controller 520 includes refresh (REF) logic 526. Refresh logic 526 can be used for memory resources that are volatile and need to be refreshed to retain a deterministic state. In one example, refresh logic 526 indicates a location for refresh, and a type of refresh to perform. Refresh logic 526 can trigger self-refresh within memory device 540, or execute external refreshes which can be referred to as auto refresh commands) by sending refresh commands, or a combination. In one example, controller 550 within memory device 540 includes refresh logic 554 to apply refresh within memory device 540. In one example, refresh logic 554 generates internal operations to perform refresh in accordance with an external refresh received from memory controller 520. Refresh logic 554 can determine if a refresh is directed to memory device 540, and what memory resources 560 to refresh in response to the command.

Figure 6:
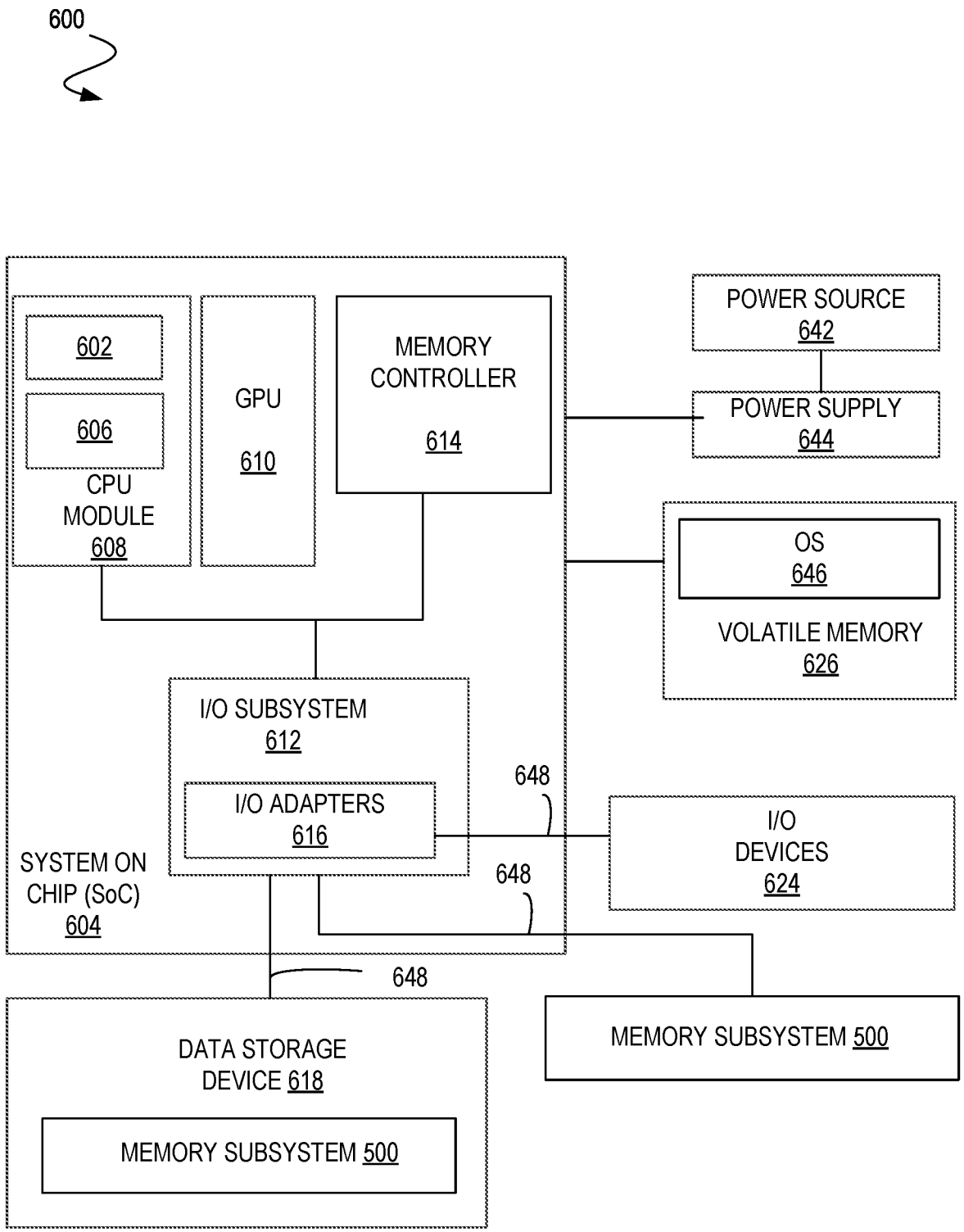
FIG. 6 is a block diagram of an embodiment of a computer system in which skip program verify for DSV sampling can be implemented in accordance with various examples described herein.

FIG. 6 is a block diagram of an embodiment of a computer system 600. Computer system 600 can correspond to a computing device including, but not limited to, a server, a workstation computer, a desktop computer, a laptop computer, and/or a tablet computer.

The computer system 600 can include a System on a Chip ("SoC") 604 which combines processor, graphics, memory, and Input/Output (I/O) control logic into one SoC package. The SoC 604 includes at least one Central Processing Unit (CPU) module 608, a memory controller 614, and a Graphics Processor Unit (GPU) 610. In other embodiments, the memory controller 614 can be external to the SoC 604. The CPU module 608 includes at least one processor core 602, and a level 2 (L2) cache 606. In one embodiment, the SoC 604 has access to or is integrated with a power source 642, a power supply 644 and a volatile memory 626, including an operating system (OS) 646. An OS 646 is software that manages computer hardware and software including memory allocation and access to I/O devices 624. Examples of operating systems (Oss) 646 include Microsoft® Windows®, Linux®, iOS® and Android®.

While various embodiments described herein use the term System-on-a-Chip or System-on-Chip ("SoC") to describe a device or system having a processor and associated circuitry (e.g., Input/Output ("I/O") circuitry, power delivery circuitry, memory circuitry, etc.) integrated monolithically into a single Integrated Circuit ("IC") die, or chip, the present disclosure is not limited in that respect. For example, in various embodiments of the present disclosure, a device or system can have one or more processors (e.g., one or more processor cores) and associated circuitry (e.g., Input/Output ("I/O") circuitry, power delivery circuitry, etc.) arranged in a disaggregated collection of discrete dies, tiles and/or chiplets (e.g., one or more discrete processor core die arranged adjacent to one or more other die such as memory die, I/O die, etc.). In such disaggregated devices and systems the various dies, tiles and/or chiplets can be physically and electrically coupled together by a package structure including, for example, various packaging substrates, interposers, active interposers, photonic interposers, interconnect bridges and the like. The disaggregated collection of discrete dies, tiles, and/or chiplets can also be part of a System-on-Package ("SoP").

Although not shown, each of the processor core(s) 602 can internally include one or more instruction/data caches, execution units, prefetch buffers, instruction queues, branch address calculation units, instruction decoders, floating point units, retirement units, etc. The CPU module 608 can correspond to a single core or a multi-core general purpose processor, such as those provided by Intel® Corporation, according to one embodiment.

The Graphics Processor Unit (GPU) 610 can include one or more GPU cores and a GPU cache which can store graphics related data for the GPU core. The GPU core can internally include one or more execution units and one or more instruction and data caches. Additionally, the Graphics Processor Unit (GPU) 610 can contain other graphics logic units that are not shown in FIG. 6, such as one or more vertex processing units, rasterization units, media processing units, and codecs.

Within the I/O subsystem 612, one or more I/O adapter(s) 616 are present to translate a host communication protocol utilized within the processor core(s) 602 to a protocol compatible with particular I/O devices. Some of the protocols that adapters can be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 616 can communicate with external I/O devices 624 which can include, for example, user interface device(s) including a display and/or a touch-screen display, printer, keypad, keyboard, communication logic, wired and/or wireless, storage device(s) including hard disk drives ("HDD"), solid-state drives ("SSD"), removable storage media, Digital Video Disk (DVD) drive, Compact Disk (CD) drive, Redundant Array of Independent Disks (RAID), tape drive or other storage device. The storage devices can be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (NVM Express) over PCIe (Peripheral Component Interconnect Express), and SATA (Serial ATA (Advanced Technology Attachment)).

Additionally, I/O adapters 616 can include one or more wireless protocol I/O adapters. Examples of wireless protocols, among others, are used in personal area networks, such as IEEE 802.15 and Bluetooth, 4.0, wireless local area networks, such as IEEE 802.11-based wireless protocols, and cellular protocols.

The I/O adapter(s) 616 can also communicate with a solid-state drive ("SSD") such as a data storage device 618, an external memory subsystem 500 or I/O devices 624. Elements of a memory subsystem as described in system 500 (FIG. 5), referred to herein as memory subsystem 500, can be included in data storage device 618 and/or included externally to SoC 604.

The I/O adapters 616 can include a Peripheral Component Interconnect Express (PCIe) adapter that is communicatively coupled using the NVMe (NVM Express) over PCIe (Peripheral Component Interconnect Express) protocol over one or more buses 648 to data storage device 618, an external memory subsystem 500 and I/O devices 624. Non-Volatile Memory Express (NVMe) standards define a register level interface for host software to communicate with a non-volatile memory subsystem (for example, a Solid-state Drive (SSD)) over Peripheral Component Interconnect Express (PCIe), a high-speed serial computer expansion bus). The NVM Express standards are available at www.nvmexpress.org. The PCIe standards are available at www.pcisig.com.

In the foregoing description examples were presented along with accompanying drawings to illustrate the various embodiments of skip program verify for DSV sampling. The description and drawings are illustrative of the various embodiments and are not to be construed as limiting. Numerous specific details were described to provide a thorough understanding of the various embodiments. However, in certain instances, well-known or conventional details were not described in order to provide a concise discussion.

It should be noted that, although the presented examples with accompanying drawings illustrated embodiments of skip program verify for DSV sampling in the context of a TLC NAND having three pages of data, embodiments of skip program verify for DSV sampling can be implemented in NAND devices of other densities, such as QLC and PLC NAND. In addition, although the presented examples with accompanying drawings illustrated embodiments of skip program verify for DSV sampling in the context of a one-pass programming algorithm to program a TLC NAND, embodiments of skip program verify for DSV sampling can be implemented for other types of programming algorithms, including multi-pass programming algorithms.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Flow diagrams or process diagrams, such as FIG. 4, provide examples of sequences of various processes. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium includes a non-transitory machine readable storage medium, and can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Additional example implementations are as follows:

Example 1 is a method, system, apparatus or computer-readable medium in which embodiments of skip program verify for dynamic start voltage sampling can be implemented in a memory device comprising a controller to program a multi-level cell (MLC) memory, including to sample a portion of the MLC memory using a series of program pulses with increasing magnitude of voltage, follow each program pulse with a series of program verifies to compare a voltage level of cells in the portion of the MLC memory against corresponding program verify threshold voltage levels until a minimum program pulse voltage to start to program the MLC memory is reached, and skip all but one or more lower level program verifies in the series of program verifies to reduce a time until the minimum program pulse voltage is reached.

Example 2 is the method, system, apparatus or computer-readable medium of Example 1 in which to skip all but one or more lower level program verifies includes to skip all but a first program verify to compare the voltage level of cells in the portion of the MLC memory being sampled against a first level (L1) threshold voltage of the corresponding program verify threshold voltage levels until the minimum program pulse voltage is reached.

Example 3 is the method, system, apparatus or computer-readable medium of any of Examples 1 and 2, in which the controller is further to resume program verifies in the series of program verifies for all corresponding program verify threshold voltage levels and program the MLC memory using the series of program pulses starting with the minimum program pulse voltage, followed by the series of program verifies, wherein a total program time (tPROG) to program the MLC memory is reduced based on reducing the time until the minimum program pulse voltage is reached.

Example 4 is the method, system, apparatus or computer-readable medium of any of Examples 1, 2 and 3 in which the controller is further to determine that a skip program verify logic to skip all but one or more lower level program verifies in the series of program verifies until the minimum program pulse voltage is reached is one of active and inactive, and to perform the skip program verify logic responsive to a determination that the skip program verify logic is active.

Example 5 is the method, system, apparatus or computer-readable medium of any of Examples 1, 2, 3 and 4 in which to sample the portion of the MLC memory is to sample a sampling sub-block of a plurality of sub-blocks of the MLC memory in which the sampling sub-block is a first sub-block of the plurality of sub-blocks of the MLC memory, the first sub-block including sub-block0 when the controller is to program the plurality of sub-blocks of the MLC memory at a beginning of a wordline, and other than sub-block0 when the controller is to program the plurality of sub-blocks of the MLC memory at an intermediate location of the wordline as a result of any of a power-interruption and a program-continuation operation.

Example 6 is the method, system, apparatus or computer-readable medium of any of Examples 1, 2, 3, 4 and 5, in which the MLC memory is a multi-level cell NAND flash memory capable of storing multiple bits of data per cell, including any one of a Triple Level Cell (TLC) NAND storing three bits of data per cell, a Quad Level Cell (QLC) NAND storing four bits of data per cell, and a Penta Level Cell (PLC) NAND storing five bits of data per cell, and the plurality of sub-blocks contain at least two pages of the MLC memory including any one of: a lower ("LP"), upper ("UP"), extra ("XP") page of the TLC NAND, and a lower ("LP"), upper ("UP"), extra ("XP") and top ("TP") page of the QLC NAND.

Example 7 is a method, system, apparatus or computer-readable medium in which embodiments of skip program verify for dynamic start voltage sampling can be implemented in a multi-level cell (MLC) memory comprising at least two pages of memory in a memory array arranged into sub-blocks and circuitry to program the at least two pages of memory using a series of program pulses followed by a series of program verifies corresponding to multiple threshold voltage levels, including to: initiate a dynamic start voltage (DSV) sampling of a first sub-block of the sub-blocks of the memory array, skip all but one or more lower level program verifies in the series of program verifies during the DSV sampling to reduce a time until a minimum program pulse voltage is reached, the one or more lower level program verifies corresponding to one or more lower threshold voltage levels of the multiple threshold voltage levels, and the circuitry further to resume the series of program verifies corresponding to all levels of the multiple threshold voltage levels and program the sub-blocks of the MLC memory, including to apply the minimum program pulse voltage as a start program voltage, wherein to skip all but the one or more lower level program verifies in the series of program verifies during the DSV sampling reduces a latency of an operation to program the sub-blocks of the MLC memory.

Example 8 is the method, system, apparatus or computer-readable medium of Example 7 in which the first sub-block is sub-block0 when the circuitry is to program the at least two pages of memory at a beginning of a wordline, and other than sub-block0 when the circuitry is to program the at least two pages of memory at an intermediate location of the wordline as a result of any of a power-interruption and a program-continuation operation.

Example 9 is the method, system, apparatus or computer-readable medium of any of Examples 7 and 8, in which the circuitry to program the at least two pages of memory at multiple threshold voltage levels further includes a skip program verify logic for DSV sampling that is one of active and inactive, the circuitry to perform the skip program verify logic to skip all but the one or more lower level program verifies to reduce the time until a minimum program pulse voltage is reached responsive to a determination that the skip program verify logic for DSV sampling is active.

Example 10 is the method, system, apparatus or computer-readable medium of any of Examples 7, 8 and 9, wherein the at least two pages of memory in the memory array arranged into sub-blocks comprises a NAND flash memory capable of storing multiple bits of data per cell, including any one of a Triple Level Cell (TLC) NAND storing three bits of data per cell, a Quad Level Cell (QLC) NAND storing four bits of data per cell, and a Penta Level Cell (PLC) NAND storing five bits of data per cell and any one of: a lower ("LP"), upper ("UP"), extra ("XP") page of the TLC NAND, and a lower ("LP"), upper ("UP"), extra ("XP") and top ("TP") page of the QLC NAND.

Example 11 is a method, system, apparatus or computer-readable medium in which embodiments of skip program verify for dynamic start voltage sampling can be implemented in a system comprising a processor, a multi-level cell (MLC) memory to store data and memory access circuitry to apply a series of program pulses with increasing magnitude of voltage to a sampling sub-block of a plurality of sub-blocks of the MLC memory, follow each program pulse with a series of program verifies applied to the sampling sub-block to compare a voltage level of cells in the sampling sub-block against corresponding program verify threshold voltage levels until a minimum program pulse voltage to start to program the plurality of sub-blocks is reached, and skip all but one or more lower level program verifies in the series of program verifies applied to the sampling sub-block to reduce a time until the minimum program pulse voltage is reached.

Example 12 is the method, system, apparatus or computer-readable medium of Example 11 in which the sampling sub-block is a first sub-block of the plurality of sub-blocks, including sub-block0 when the memory access circuitry is to program sub-blocks of the MLC memory at a beginning of a wordline and other than sub-block0 when the memory access circuitry is to program sub-blocks of the MLC memory at an intermediate location of the wordline as a result of any of a power-interruption and a program-continuation operation.

Example 13 is the method, system, apparatus or computer-readable medium of any of Examples 11 and 12, in which the memory access circuitry is further to resume all program verifies in the series of program verifies for all corresponding program verify threshold voltage levels, program the plurality of sub-blocks using the series of program pulses starting with the minimum program pulse voltage, followed by the series of program verifies and wherein a total program time (tPROG) to program the plurality of sub-blocks is reduced based on reducing the time until the minimum program pulse voltage is reached.

Example 14 is the method, system, apparatus or computer-readable medium of any of Examples 11, 12 and 13, in which the memory access circuitry is further to determine that a skip program verify logic to skip all but one or more lower level program verifies in the series of program verifies until the minimum program pulse voltage is reached is one of active and inactive and to perform the skip program verify logic responsive to a determination that the skip program verify logic is active.

Example 15 is the method, system, apparatus or computer-readable medium of any of Examples 11, 12, 13 and 14, wherein the MLC memory is an MLC NAND flash memory device capable of storing multiple bits of data per cell, including any one of a Triple Level Cell (TLC) NAND storing three bits of data per cell, a Quad Level Cell (QLC) NAND storing four bits of data per cell, and a Penta Level Cell (PLC) NAND storing five bits of data per cell and the MLC NAND flash memory device contains at least two pages of the MLC memory including any one of: a lower ("LP"), upper ("UP"), extra ("XP") page of the TLC NAND, and a lower ("LP"), upper ("UP"), extra ("XP") and top ("TP") page of the QLC NAND.

Example 16 is a method, system, apparatus or computer-readable medium in which embodiments of skip program verify for dynamic start voltage sampling can be implemented in one or more non-transitory machine-readable media comprising a plurality of instructions encoded thereon that, in response to being executed, cause any of a device, system and apparatus having a memory in which to store data to apply a series of program pulses with increasing magnitude of voltage to a sampling sub-block of a plurality of sub-blocks of a multi-level cell (MLC) memory, follow each program pulse with a series of program verifies applied to the sampling sub-block to compare a voltage level of cells in the sampling sub-block against corresponding program verify threshold voltage levels until a minimum program pulse voltage to start to program the plurality of sub-blocks is reached, and skip all but one or more lower level program verifies in the series of program verifies applied to the sampling sub-block to reduce a time until the minimum program pulse voltage is reached.

Example 17 is the method, system, apparatus or computer-readable medium of Example 16 in which the sampling sub-block is a first sub-block of the plurality of sub-blocks, including sub-block0 when, in response to being executed, the plurality of instructions encoded thereon cause any of the device, system and apparatus to program sub-blocks of the MLC memory at a beginning of a wordline and other than sub-block0 when, in response to being executed, the plurality of instructions encoded thereon cause any of the device, system and apparatus is to program sub-blocks of the MLC memory at an intermediate location of the wordline as a result of any of a power-interruption and a program-continuation operation.

Example 18 is the method, system, apparatus or computer-readable medium of Example 16 and 17 in which the plurality of instructions is further to cause any of the device, system and apparatus to resume all program verifies in the series of program verifies for all corresponding program verify threshold voltage levels, program the plurality of sub-blocks using the series of program pulses starting with the minimum program pulse voltage, followed by the series of program verifies, and wherein a total program time (tPROG) to program the plurality of sub-blocks is reduced based on reducing the time until the minimum program pulse voltage is reached.

Example 19 is the method, system, apparatus or computer-readable medium of Example 16, 17 and 18 in which the plurality of instructions is further to cause any of the device, system and apparatus to determine that a skip program verify logic to skip all but one or more lower level program verifies in the series of program verifies until the minimum program pulse voltage is reached is one of active and inactive and perform the skip program verify logic responsive to a determination that the skip program verify logic is active.

Example 20 is the method, system, apparatus or computer-readable medium of Example 16, 17, 18 and 19, in which the MLC memory is an MLC NAND flash memory device capable of storing multiple bits of data per cell, including any one of a Triple Level Cell (TLC) NAND storing three bits of data per cell, a Quad Level Cell (QLC)

NAND storing four bits of data per cell, and a Penta Level Cell (PLC) NAND storing five bits of data per cell, and the MLC NAND flash memory device contains at least two pages of the MLC memory including any one of: a lower ("LP"), upper ("UP"), extra ("XP") page of the TLC NAND, and a lower ("LP"), upper ("UP"), extra ("XP") and top ("TP") page of the QLC NAND.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device comprising:
a controller to program a multi-level cell (MLC) memory, including to:
   sample a portion of the MLC memory using a series of program pulses with increasing magnitude of voltage;
   follow each program pulse with a series of program verifies to compare a voltage level of cells in the portion of the MLC memory against corresponding program verify threshold voltage levels until a minimum program pulse voltage to start to program the MLC memory is reached; and
   skip all but one or more lower level program verifies in the series of program verifies to reduce a time until the minimum program pulse voltage is reached.

2. A memory device as in claim 1, wherein to skip all but one or more lower level program verifies includes to skip all but a first program verify to compare the voltage level of cells in the portion of the MLC memory being sampled against a first level (L1) threshold voltage of the corresponding program verify threshold voltage levels until the minimum program pulse voltage is reached.

3. A memory device as in claim 1, the controller further to:
   resume program verifies in the series of program verifies for all corresponding program verify threshold voltage levels;
   program the MLC memory using the series of program pulses starting with the minimum program pulse voltage, followed by the series of program verifies; and
   wherein a total program time (tPROG) to program the MLC memory is reduced based on reducing the time until the minimum program pulse voltage is reached.

4. A memory device as in claim 1, the controller further to:
   determine that a skip program verify logic to skip all but one or more lower level program verifies in the series of program verifies until the minimum program pulse voltage is reached is one of active and inactive; and
   the controller to perform the skip program verify logic responsive to a determination that the skip program verify logic is active.

5. A memory device as in claim 1, wherein:
to sample the portion of the MLC memory is to sample a sampling sub-block of a plurality of sub-blocks of the MLC memory in which the sampling sub-block is a first sub-block of the plurality of sub-blocks of the MLC memory, the first sub-block including:
   sub-block0 when the controller is to program the plurality of sub-blocks of the MLC memory at a beginning of a wordline, and
   other than sub-block0 when the controller is to program the plurality of sub-blocks of the MLC memory at an intermediate location of the wordline as a result of any of a power-interruption and a program-continuation operation.

6. A memory device as in claim 5, wherein:
the MLC memory is a multi-level cell NAND flash memory capable of storing multiple bits of data per cell, including any one of a Triple Level Cell (TLC) NAND storing three bits of data per cell, a Quad Level Cell (QLC) NAND storing four bits of data per cell, and a Penta Level Cell (PLC) NAND storing five bits of data per cell; and
the plurality of sub-blocks contain at least two pages of the MLC memory including any one of:
   a lower ("LP"), upper ("UP"), extra ("XP") page of the TLC NAND, and
   a lower ("LP"), upper ("UP"), extra ("XP") and top ("TP") page of the QLC NAND.

7. A multi-level cell (MLC) memory comprising:
at least two pages of memory in a memory array arranged into sub-blocks; and
circuitry to program the at least two pages of memory using a series of program pulses followed by a series of program verifies corresponding to multiple threshold voltage levels, including to:
   initiate a dynamic start voltage (DSV) sampling of a first sub-block of the sub-blocks of the memory array,
   skip all but one or more lower level program verifies in the series of program verifies during the DSV sampling to reduce a time until a minimum program pulse voltage is reached, the one or more lower level program verifies corresponding to one or more lower threshold voltage levels of the multiple threshold voltage levels, and
   resume the series of program verifies corresponding to all levels of the multiple threshold voltage levels;
   program the sub-blocks of the MLC memory, including to apply the minimum program pulse voltage as a start program voltage; and
wherein to skip all but the one or more lower level program verifies in the series of program verifies during the DSV sampling reduces a latency of an operation to program the sub-blocks of the MLC memory.

8. An MLC memory as in claim 7, wherein:
the first sub-block is sub-block0 when the circuitry is to program the at least two pages of memory at a beginning of a wordline; and
the first sub-block is other than sub-block0 when the circuitry is to program the at least two pages of memory at an intermediate location of the wordline as a result of any of a power-interruption and a program-continuation operation.

9. An MLC memory as in claim 7, wherein the circuitry to program the at least two pages of memory at multiple threshold voltage levels further includes:
a skip program verify logic for DSV sampling that is one of active and inactive; and
the circuitry to perform the skip program verify logic to skip all but the one or more lower level program verifies to reduce the time until the minimum program pulse voltage is reached responsive to a determination that the skip program verify logic for DSV sampling is active.

10. An MLC memory as in claim 7, wherein the at least two pages of memory in the memory array arranged into sub-blocks comprises:
   a NAND flash memory capable of storing multiple bits of data per cell, including any one of a Triple Level Cell (TLC) NAND storing three bits of data per cell, a Quad Level Cell (QLC) NAND storing four bits of data per cell, and a Penta Level Cell (PLC) NAND storing five bits of data per cell; and
   any one of:
      a lower ("LP"), upper ("UP"), extra ("XP") page of the TLC NAND, and
      a lower ("LP"), upper ("UP"), extra ("XP") and top ("TP") page of the QLC NAND.

11. A system comprising:
   a processor;
   a multi-level cell (MLC) memory to store data; and
   memory access circuitry to:
      apply a series of program pulses with increasing magnitude of voltage to a sampling sub-block of a plurality of sub-blocks of the MLC memory,
      follow each program pulse with a series of program verifies applied to the sampling sub-block to compare a voltage level of cells in the sampling sub-block against corresponding program verify threshold voltage levels until a minimum program pulse voltage to start to program the plurality of sub-blocks is reached, and
      skip all but one or more lower level program verifies in the series of program verifies applied to the sampling sub-block to reduce a time until the minimum program pulse voltage is reached.

12. A system as in claim 11, wherein:
   the sampling sub-block is a first sub-block of the plurality of sub-blocks, including sub-block0 when the memory access circuitry is to program sub-blocks of the MLC memory at a beginning of a wordline; and
   the first sub-block is other than sub-block0 when the memory access circuitry is to program sub-blocks of the MLC memory at an intermediate location of the wordline as a result of any of a power-interruption and a program-continuation operation.

13. A system as in claim 11, the memory access circuitry further to:
   resume all program verifies in the series of program verifies for all corresponding program verify threshold voltage levels;
   program the plurality of sub-blocks using the series of program pulses starting with the minimum program pulse voltage, followed by the series of program verifies; and
   wherein a total program time (tPROG) to program the plurality of sub-blocks is reduced based on reducing the time until the minimum program pulse voltage is reached.

14. A system as in claim 11, the memory access circuitry further to:
   determine that a skip program verify logic to skip all but one or more lower level program verifies in the series of program verifies until the minimum program pulse voltage is reached is one of active and inactive; and
   the memory access circuitry to perform the skip program verify logic responsive to a determination that the skip program verify logic is active.

15. A system as in claim 11, wherein:
   the MLC memory is an MLC NAND flash memory device capable of storing multiple bits of data per cell, including any one of a Triple Level Cell (TLC) NAND storing three bits of data per cell, a Quad Level Cell (QLC) NAND storing four bits of data per cell, and a Penta Level Cell (PLC) NAND storing five bits of data per cell; and
   the MLC NAND flash memory device contains at least two pages of the MLC memory including any one of:
      a lower ("LP"), upper ("UP"), extra ("XP") page of the TLC NAND, and
      a lower ("LP"), upper ("UP"), extra ("XP") and top ("TP") page of the QLC NAND.

16. One or more non-transitory machine-readable media comprising a plurality of instructions encoded thereon that, in response to being executed, cause any of a device, system and apparatus having a memory in which to store data, to:
   apply a series of program pulses with increasing magnitude of voltage to a sampling sub-block of a plurality of sub-blocks of a multi-level cell (MLC) memory,
   follow each program pulse with a series of program verifies applied to the sampling sub-block to compare a voltage level of cells in the sampling sub-block against corresponding program verify threshold voltage levels until a minimum program pulse voltage to start to program the plurality of sub-blocks is reached, and
   skip all but one or more lower level program verifies in the series of program verifies applied to the sampling sub-block to reduce a time until the minimum program pulse voltage is reached.

17. One or more non-transitory machine-readable media as in claim 16, wherein:
   the sampling sub-block is a first sub-block of the plurality of sub-blocks, including sub-block0 when, in response to being executed, the plurality of instructions encoded thereon cause any of the device, system and apparatus to program sub-blocks of the MLC memory at a beginning of a wordline; and
   the first sub-block is other than sub-block0 when, in response to being executed, the plurality of instructions encoded thereon cause any of the device, system and apparatus is to program sub-blocks of the MLC memory at an intermediate location of the wordline as a result of any of a power-interruption and a program-continuation operation.

18. One or more non-transitory machine-readable media as in claim 16, wherein the plurality of instructions encoded thereon is further to cause any of the device, system and apparatus to:
   resume all program verifies in the series of program verifies for all corresponding program verify threshold voltage levels;
   program the plurality of sub-blocks using the series of program pulses starting with the minimum program pulse voltage, followed by the series of program verifies; and
   wherein a total program time (tPROG) to program the plurality of sub-blocks is reduced based on reducing the time until the minimum program pulse voltage is reached.

19. One or more non-transitory machine-readable media as in claim 16, wherein the plurality of instructions encoded thereon is further to cause any of the device, system and apparatus to:
   determine that a skip program verify logic to skip all but one or more lower level program verifies in the series of program verifies until the minimum program pulse voltage is reached is one of active and inactive; and perform the skip program verify logic responsive to a determination that the skip program verify logic is active.

20. One or more non-transitory machine-readable media as in claim 16, wherein:
- the MLC memory is an MLC NAND flash memory device capable of storing multiple bits of data per cell, including any one of a Triple Level Cell (TLC) NAND storing three bits of data per cell, a Quad Level Cell (QLC) NAND storing four bits of data per cell, and a Penta Level Cell (PLC) NAND storing five bits of data per cell; and
- the MLC NAND flash memory device contains at least two pages of the MLC memory including any one of:
  - a lower ("LP"), upper ("UP"), extra ("XP") page of the TLC NAND, and
  - a lower ("LP"), upper ("UP"), extra ("XP") and top ("TP") page of the QLC NAND.

* * * * *